United States Patent
Koo et al.

(10) Patent No.: US 7,259,419 B2
(45) Date of Patent: Aug. 21, 2007

(54) PROGRAMMABLE MEMORY DEVICE, INTEGRATED CIRCUIT INCLUDING THE PROGRAMMABLE MEMORY DEVICE, AND METHOD OF FABRICATING SAME

(75) Inventors: Jeoung-Mo Koo, Namyangju (KR); Hee-Seon Oh, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/799,201

(22) Filed: Mar. 12, 2004

(65) Prior Publication Data

US 2004/0238873 A1 Dec. 2, 2004

(30) Foreign Application Priority Data

May 26, 2003 (KR) ............. 10-2003-0033346

(51) Int. Cl.
*H01L 29/76* (2006.01)
(52) U.S. Cl. ............. 257/314; 257/315; 257/316; 257/321; 257/E29.3
(58) Field of Classification Search ........ 257/314–321, 257/392, 638, 29.3; 438/201, 211, 257
See application file for complete search history.

(56) References Cited

U.S. PATENT DOCUMENTS

| | | | |
|---|---|---|---|
| 3,906,296 A * | 9/1975 | Maserjian et al. ............. 257/30 |
| 4,823,175 A * | 4/1989 | Fontana ...................... 257/321 |
| 5,514,889 A | 5/1996 | Cho et al. .................... 257/316 |
| 5,576,233 A * | 11/1996 | Hutter et al. ................ 438/265 |
| 5,633,520 A * | 5/1997 | Wu et al. .................... 257/315 |
| 5,866,455 A * | 2/1999 | Wu ............................. 438/255 |
| 5,888,869 A | 3/1999 | Cho et al. .................... 438/258 |
| 5,898,613 A * | 4/1999 | Diorio et al. ............. 365/185.03 |
| 5,907,171 A * | 5/1999 | Santin et al. ................ 257/315 |
| 6,023,085 A | 2/2000 | Fang ........................... 257/315 |
| 6,037,625 A * | 3/2000 | Matsubara et al. .......... 257/315 |
| 6,128,212 A * | 10/2000 | Nakamura et al. .......... 365/145 |
| 6,339,000 B1 * | 1/2002 | Bhattacharya et al. ...... 438/261 |
| 6,348,378 B1 * | 2/2002 | Lee .............................. 438/257 |
| 6,429,073 B1 * | 8/2002 | Furuhata et al. ............ 438/258 |
| 6,472,259 B1 | 10/2002 | Naito et al. ................. 438/201 |
| 6,815,755 B2 * | 11/2004 | Colclaser et al. ............ 257/314 |
| 2005/0074935 A1 * | 4/2005 | Hsu ............................ 438/200 |

FOREIGN PATENT DOCUMENTS

| | | |
|---|---|---|
| EP | 1058309 A1 | 12/2000 |
| JP | 2001313374 | 11/2001 |
| KR | 2001-0014697 | 2/2001 |

* cited by examiner

*Primary Examiner*—Kenneth Parker
*Assistant Examiner*—José R. Diaz
(74) *Attorney, Agent, or Firm*—F. Chau & Assoc., LLC

(57) ABSTRACT

An integrated circuit comprises a memory device including an isolation layer for defining an active area of a substrate, a tunnel oxide layer formed on the active area, a floating gate formed over the active area and the isolation layer, an inter-gate dielectric layer formed on the floating gate, and a control gate formed on the inter-gate dielectric layer. The integrated circuit also includes a high and low voltage transistors.

4 Claims, 8 Drawing Sheets

PROGRAMMABLE MEMORY DEVICE, INTEGRATED CIRCUIT INCLUDING THE PROGRAMMABLE MEMORY DEVICE, AND METHOD OF FABRICATING SAME

BACKGROUND OF THE INVENTION

This application claims the priority of Korean Patent Application No. 2003-33346, filed on May 26, 2003, in the Korean Intellectual Property Office, the disclosure of which is incorporated herein in its entirety by reference.

1. Technical Field

The present disclosure relates to a nonvolatile memory device and a method of fabricating same. More particularly, the present invention relates to a one-time programmable (OTP) memory device and a method of fabricating the OTP memory device.

2. Discussion of the Related Art

Nonvolatile memory devices are devices from which data is not erased even with discontinued power and which are used to selectively program data according to the needs of a user. OTP memory devices are used for programming data only one time without erasing or adding data. Demand for OTP memory devices has been increasing.

A cell area of an OTP memory device may have a layout as shown in FIG. 1. FIG. 2 is a cross-sectional view taken along line II-II' of FIG. 1, and FIG. 3 is a cross-sectional view taken along line III-III' of FIG. 1. The cell structure of a conventional OTP memory device and a method of fabricating same will be described with reference to FIGS. 1 through 3.

As shown in FIGS. 2 and 3, the cell of the OTP memory device includes a tunnel oxide layer 15, a floating gate 20, a dielectric layer 40, and a control gate 50 in a stacked structure. The tunnel oxide layer 15 is formed on a substrate 1 on which an isolation layer 5 is formed. A source region 60 and a drain region 65 are formed in the substrate 1 under and adjacent both sides of the control gate 50. In the OTP memory device having the above-described stacked structure, as electrons are induced by a strong electric field and move through the tunnel oxide layer 15 with a thickness of about 100 Å, a threshold voltage of the cell area varies. As a result, the OTP memory device can perform a programming function. The tunnel oxide layer 15 is used as a gate oxide layer of the OTP memory device. The label tunnel oxide layer 15 derives from the fact that the electrons move inside the tunnel oxide layer 15.

Such an OTP memory device may be used to assist with functions of various types of semiconductor products. For example, an OTP memory device may be embedded in a liquid crystal display driver integrated circuit (LDI) so as to write various kinds of information. The process required to embed a cell of an OTP memory device within the stack structure shown in FIGS. 1 through 3 in an existing integrated circuit (IC) is complicated. When using an OTP memory device having the stacked structure, the number of processes for completing the IC increases and the cost of fabricating the IC increases.

The OTP memory device may be integrated with metal-oxide-semiconductor (MOS) transistors into one circuit on a semiconductor substrate. In order to fabricate the semiconductor IC, a thick oxide layer, for example, a gate oxide layer of the MOS transistor, is first formed on the substrate 1. Next, using a photolithographic process, the entire thick oxide layer or a portion thereof is removed from an area where the OTP memory device is to be formed. Thereafter, the thin tunnel oxide layer 15 is formed in the area. Materials for forming the floating gate 20, the dielectric layer 40, and the control gate 50 are subsequently deposited and patterned. Next, ions are implanted into an active area 10 to form the source region 60 and the drain region 65.

During removal of the entire thick gate oxide layer or a portion thereof using the photolithographic process, and the formation of the thin tunnel oxide layer 15, the gate oxide layer may be exposed to chemicals during formation and removal of a photoresist. Thus, the reliability of the MOS transistor may deteriorate. In particular, gate oxide layers of the MOS transistors may have different thicknesses so that the MOS transistors are used as high and low voltage transistors.

SUMMARY OF THE INVENTION

A one-time programmable memory device, according to an embodiment of the present invention, includes an isolation layer for defining an active area of a substrate, an oxide layer formed on the active area, a floating gate formed over the active area and the isolation layer, an inter-gate dielectric layer formed on the floating gate, and a control gate formed on the inter-gate dielectric layer.

Source and drain regions may be formed in the active area at least one of under and adjacent both sides of the control gate. A portion of the floating gate formed over the active area may be narrower than a portion of the floating gate formed over the isolation layer. The control gate may be formed over the floating gate or may be formed so as to enclose a sidewall of the floating gate. The inter-gate dielectric layer may include a silicon nitride layer. The inter-gate dielectric layer may include a composite layer having a silicon oxide layer and a silicon nitride layer or a composite layer having a silicon oxide layer, a silicon nitride layer, and a silicon oxide layer.

A method of fabricating an IC including a one-time programmable memory device and MOS transistors, in accordance with an embodiment of the present invention, includes forming a tunnel oxide layer in a cell area of the one-time programmable memory device, forming a floating gate, forming an inter-gate dielectric layer the floating gate, and forming gate oxide layers of the MOS transistors. Gates of the MOS transistors may be formed when a control gate of the memory device is formed.

A method of fabricating an integrated circuit, in accordance with an embodiment of the present invention, includes forming a plurality of isolation layers for defining a first active area and a second active area in a substrate, forming a tunnel oxide layer on the substrate, forming and patterning a floating gate material on a surface of the substrate including the tunnel oxide layer, to form a floating gate, forming an inter-gate dielectric layer including a composite layer having a silicon oxide layer and a silicon nitride layer on a surface of the substrate including the floating gate, etching a portion of the inter-gate dielectric layer in the second active area to form a first gate oxide layer of a high voltage transistor, the first gate oxide layer being thicker than the tunnel oxide layer, forming and patterning a conductive material on a surface of the substrate including the inter-gate dielectric layer and the first gate oxide layer, to form the control gate and a first gate of the high voltage transistor, forming an interlayer insulating layer including a contact hole on the resultant structure, and forming a metal interconnection connectable to the control gate via the contact hole.

The substrate may include a third active area. A portion of the inter-gate dielectric layer in the third active area may be etched. A second gate oxide layer of a low voltage transistor may be formed and may have a thickness less than or equal to a thickness of the tunnel oxide layer. A second gate of the low voltage transistor may be formed in the third active area when forming and patterning the conductive material to from the control gate and the first gate of the high voltage transistor.

After the formation of the control gate and the gates of the high and low voltage transistors, source and drain regions may be formed in each of the first, second, and third active areas. Ions may be implanted into the first active area of the substrate to adjust a threshold voltage. Ion implantation may be performed between the formation of the isolation layers and the formation of the tunnel oxide layer.

At least one of the floating gate and the control gate may be formed of a noble metal, a noble metal oxide, a conductive oxide, or combinations of the noble metal, the noble metal oxide, and the conductive oxide.

An integrated circuit, in accordance with an embodiment of the present invention, comprises a memory device including an isolation layer for defining an active area of a substrate, a tunnel oxide layer formed on the active area, a floating gate formed over the active area and the isolation layer, an inter-gate dielectric layer formed on the floating gate, and a control gate formed on the inter-gate dielectric layer, a first transistor including a first gate, a first gate oxide layer interposed between the first gate and the substrate, and a first source region and a first drain region formed in the active area at least one of under and adjacent both sides of the first gate, and a second transistor including a second gate, a second gate oxide layer interposed between the second gate and the substrate, and a second source region and a second drain region formed in the active area at least one under and adjacent both sides of the second gate.

The memory device may further include a source region and a drain region formed in the active area at least one of under and adjacent both sides of the control gate. The second gate oxide layer may be thinner than the first gate oxide layer and the tunnel oxide layer, and the first gate oxide layer may be thicker than the tunnel oxide layer and the second gate oxide layer. The second gate oxide layer may have the same thickness as the tunnel oxide layer, and the first gate oxide layer may be thicker than the tunnel oxide layer and the second gate oxide layer. The first gate and the second gate may be formed of the same material as the control gate.

An integrated circuit, in accordance with an embodiment of the present invention, comprises a plurality of isolation layers for defining a first area, a second area, and a third area in a substrate; a memory device including a floating gate formed over the first area and at least one isolation layer of the plurality of isolation layers, an inter-gate dielectric layer formed on the floating gate and including a composite layer having a silicon oxide layer and a silicon nitride layer, and a control gate formed on the inter-gate dielectric layer; a first transistor including a first gate formed of the same material as the control gate, wherein the first gate is formed in the second area of the substrate on a first gate oxide layer having a thickness greater than or equal to a thickness of a tunnel oxide layer formed on the substrate, and a first source region and a first drain region formed in the second area at least one of under and adjacent both sides of the first gate; and a second transistor including a second gate formed of the same material as the control gate, wherein the second gate is formed in the third area of the substrate on a second gate oxide layer thinner than the first gate oxide layer, and a second source region and a second drain region formed in the third area at least one of under and adjacent both sides of the second gate.

A portion of the floating gate over the first area may be narrower than a portion of the floating gate over the at least one isolation layer.

BRIEF DESCRIPTION OF THE DRAWINGS

Preferred embodiments of the present invention can be understood in more detail from the following descriptions taken in conjunction with the accompanying drawings in which.

DETAILED DESCRIPTION OF THE PREFERRED EMBODIMENTS

Figure 1:
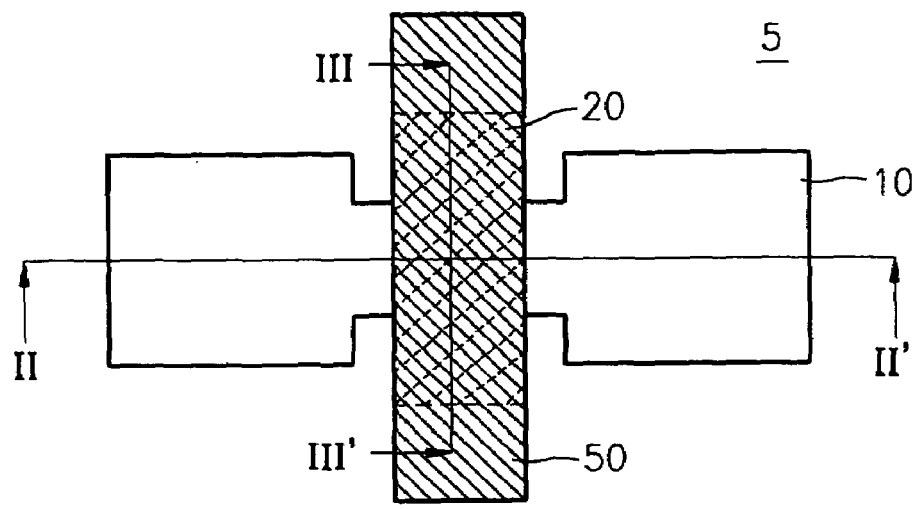
FIG. 1 is a layout view of a conventional one-time programmable memory device.
Figure 2:
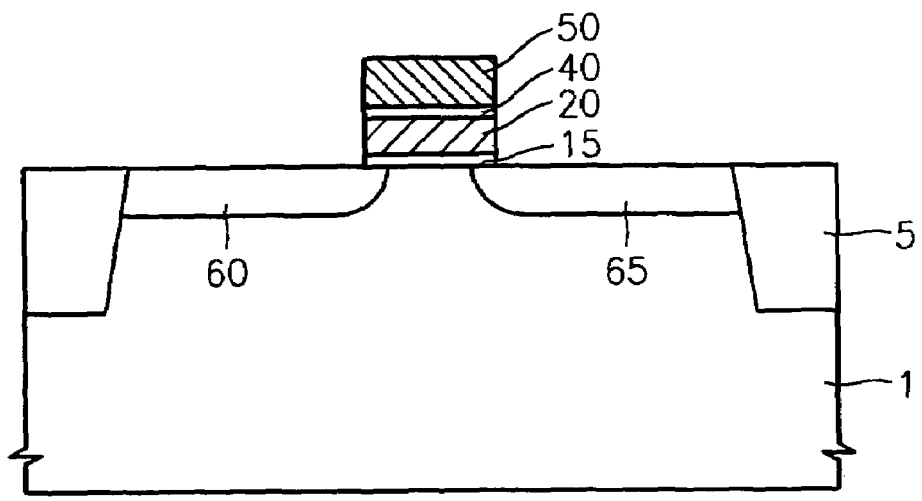
FIG. 2 is a cross-sectional view taken along line II-II' of FIG. 1.
Figure 3:
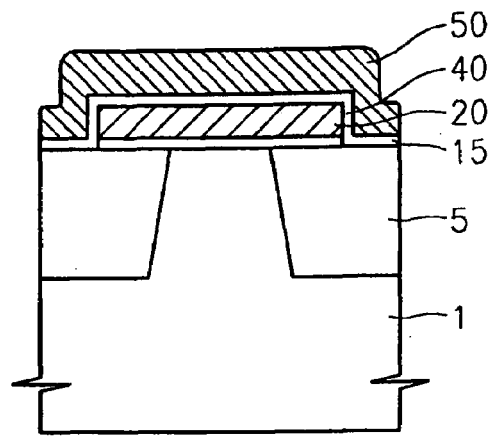
FIG. 3 is a cross-sectional view taken along line III-III' of FIG. 1.

Preferred embodiments of the present invention will be described below in more detail with reference to the accompanying drawings. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the forms of elements may be exaggerated for clarity. To facilitate understanding, identical reference numerals have been used, where possible, to designate identical elements that are common to the figures.

Figure 4:
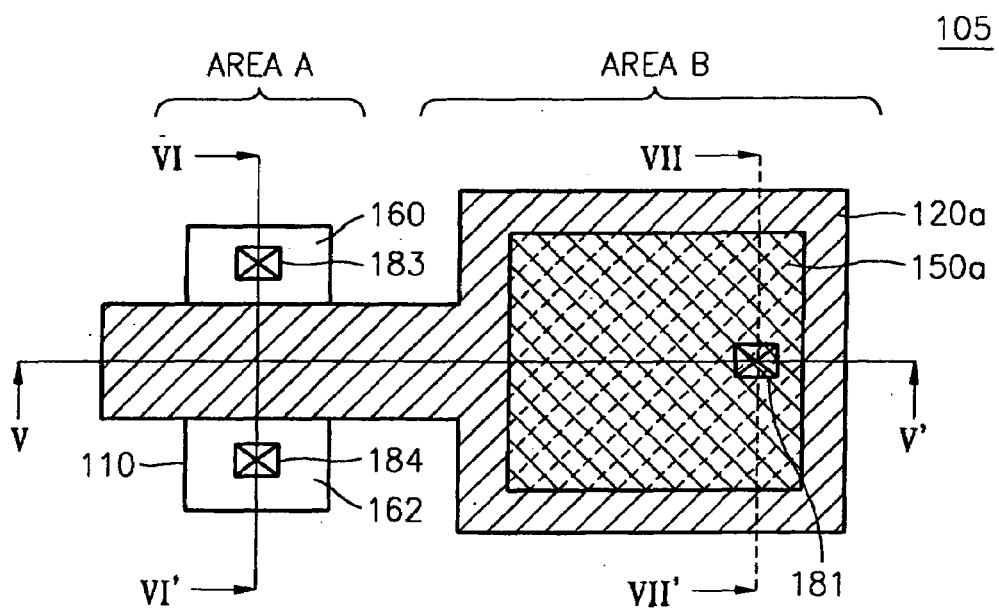
FIG. 4 is a layout view of a one-time programmable memory device according to an embodiment of the present invention.
Figure 5:
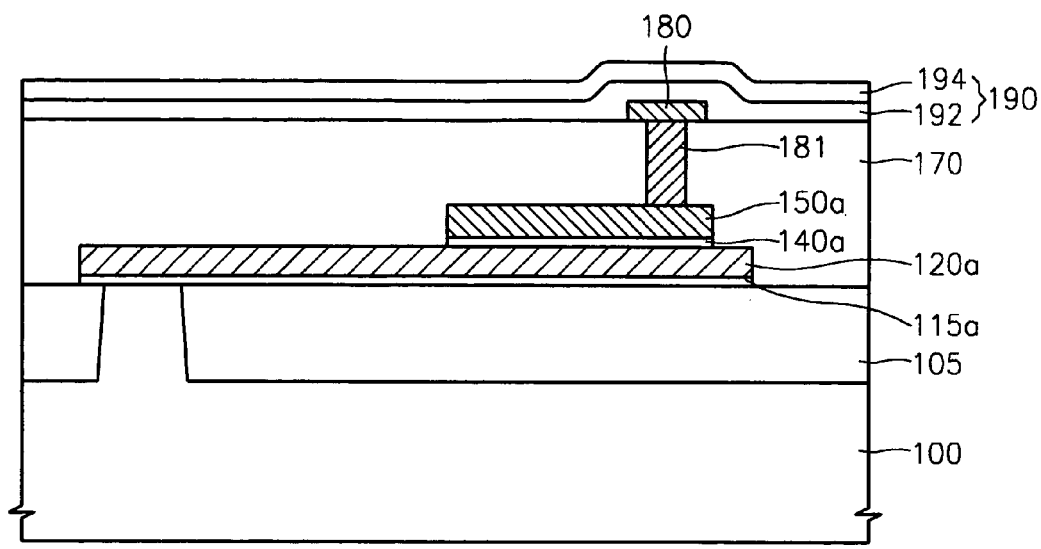
FIG. 5 is a cross-sectional view taken along line V-V' of FIG. 4.
Figure 6:
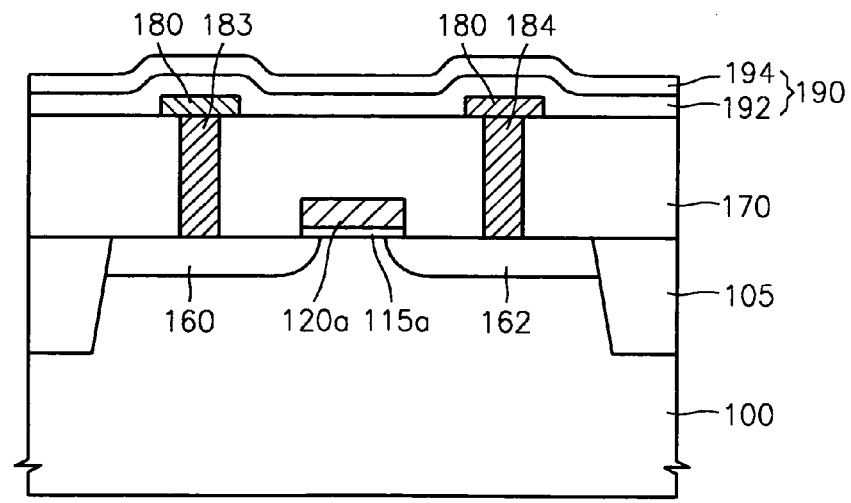
FIG. 6 is a cross-sectional view taken along line VI-VI' of FIG. 4.
Figure 7:
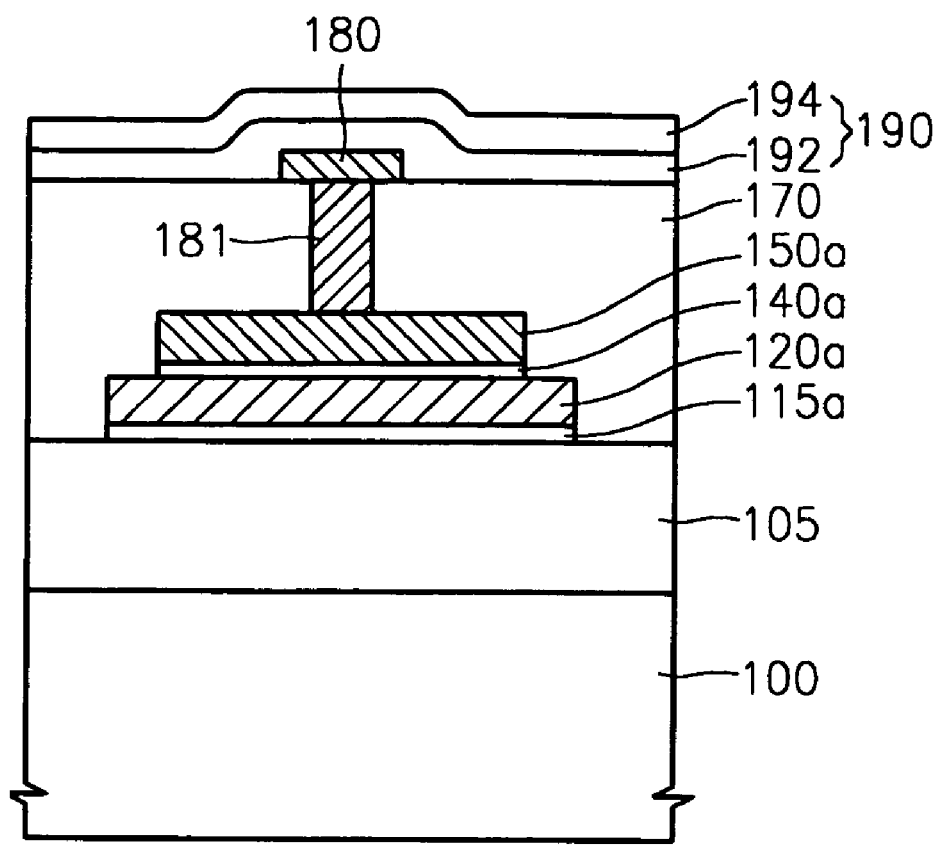
FIG. 7 is a cross-sectional view taken along line VII-VII' of FIG. 4.

FIG. 4 is a layout view of a one-time programmable memory device according to an embodiment of the present invention. FIG. 5 is a cross-sectional view taken along line V-V' of FIG. 4. FIG. 6 is a cross-sectional view taken along line VI-VI' of FIG. 4. FIG. 7 is a cross-sectional view taken along line VII-VII' of FIG. 4.

Referring to FIGS. 4 through 7, the OTP memory device according to an embodiment of the present invention has a stacked structure including a tunnel oxide layer 115*a*, a floating gate 120*a*, an inter-gate dielectric layer 140*a*, and a control gate 150*a*. The stacked structure is divided into a transistor in area A and a capacitor in area B.

Referring to FIG. 4, a portion of the floating gate 120*a* over an active area 110 is narrower than a portion of the floating gate 120*a* over an isolation layer 105. Thus, the floating gate 120*a* is T-shaped. For convenience, the narrow portion of gate 120*a* a "head portion". The control gate 150*a* is deposited over the head portion of the floating gate 120*a*.

As shown in FIGS. 4 and 5, the OTP memory device includes the isolation layer 105 which defines the active area 110 of a semiconductor substrate 100. The tunnel oxide layer 115a is formed over the active area 110, and the control gate 150a is formed over the isolation layer 105. The inter-gate dielectric layer 140a is interposed between the floating gate 120a and the control gate 150a. The floating gate 120a overlaps the control gate 150a and extends to the active area 110. In other words, the head portion of the floating gate 120a is formed over the isolation layer 105 and the leg portion thereof is formed over the active area 110. As shown in FIGS. 4 and 6, a source region 160 and a drain region 162 are formed in the active area 110 under and adjacent both sides of the leg portion of the floating gate 120. Contacts 183 and 184 may be formed on the source region 160 and the drain region 162, respectively, to supply the source region 160 and the drain region 162 with power.

The inter-gate dielectric layer 140a may include a silicon nitride layer. For example, the inter-gate dielectric layer 140a may be formed of an oxide nitride (ON) composite layer of a silicon oxide layer and a silicon nitride layer or may be formed of an oxide-nitride-oxide (ONO) composite layer of a silicon oxide layer, a silicon nitride layer, and a silicon oxide layer. The floating gate 120a and the control gate 150a may be formed of doped polysilicon layers. The inter-gate dielectric layer 140a may also be formed of a material having a dielectric constant that is several or several hundred times as high as the dielectric constant of the ONO composite layer. For example, the inter-gate dielectric layer 140a may be formed of a metal oxide such as $Ta_2O_5$, TaON, $Al_2O_3$, a perovskite structure material such as $(Ba, Sr)TiO_3$ (BST), $SrTiO_3$, $BaTiO_3$, or $(Pb, Zr)TiO_3$(PZT), or a high dielectric constant material such as $(Pb, La, Zr)TiO_3$(PLZT). In this case, at least one of the floating gate 120a and the control gate 150 may be formed of a noble metal, a noble metal oxide, a conductive oxide, or combinations of the noble metal, the noble metal oxide, and the conductive oxide. For example, the noble metal may be platinum (Pt), ruthenium (Ru), iridium (Ir), rhodium (Rh), or the like, the noble metal oxide may be PtO, $RuO_2$, or $IrO_2$, and the conductive oxide may be $(La, Sr)CoO_3$, TiN, $BaSrRuO_3$, or $SrRuO_3$.

An interlayer insulating layer 170 may be formed of phosphorus silicate glass (PSG), boron phosphorus silicate glass (BPSG), or undoped silicate glass (USG) on the intermediate structure to cover the control gate 150a using high pressure chemical vapor deposition (HPCVD) or plasma CVD. A contact 181 is formed in the interlayer insulating layer 170 to supply the control gate 150a with power. The control gate 150a is connected to a metal interconnection 180 via the contact 181. A passivation layer 190 is formed on the resultant structure to cover the metal interconnection 180.

In the present embodiment, the control gate 150a is deposited only over the head portion of the floating gate 120a. Alternatively, the control gate 150a may extend from the head portion of the floating gate 120a onto the isolation layer 105 so as to surround the sidewall of the head portion of the floating gate 120a. With this structure, the contact 181 may be formed from the head portion of the floating gate 120a to the extending portion of the control gate 150a, so as to prevent the characteristics of the cell from being deteriorated during etching of the interlayer insulating layer 170 to form a contact hole.

The passivation layer 190 may include an insulator, for example, an oxide layer 192, a nitride layer 194, or a stack of the oxide layer 192 and the nitride layer 194. The metal interconnection 180 may be connected to an external conductive material, for example, a bonding wire, a bump, or a lead, via a pad opening area (not shown) which is formed in the passivation layer 190. The passivation layer 190 may be coated with a polyimide or the like so as to prevent deterioration of the characteristics of the cell.

FIG. 6 is a cross-sectional view taken along line VI-VI' of FIG. 4, i.e., a cross-sectional view of the area A of FIG. 4. Referring to FIG. 6, the source region 160 and the drain region 162 are interposed in the active area 110 under and adjacent both sides of the floating gate 120a. Thus, the floating gate 120a, the source region 160, and the drain region 162 form a transistor.

FIG. 7 is a cross-sectional view taken along line VII-VII', i.e., a cross-sectional view of the area B of FIG. 4. Referring to FIG. 7, the inter-gate dielectric layer 140a and the control gate 150a are formed on the floating gate 120a so as to form a capacitor. The control gate 150a is connected to the metal interconnection 180 in the interlayer insulating layer 170. As a result, the OTP memory device according to an embodiment of the present invention can be called a "spread capacitor" with respect to the above-described structure.

An existing capacitor may have a stacked structure of polysilicon, a dielectric, and polysilicon or a stacked structure of a metal, a dielectric, and a metal and may have already been used in a semiconductor product in which an OTP memory device is to be embedded. In this case, a lower layer of the existing capacitor may be used as a floating gate and an upper layer of the spread capacitor may be used as a control gate. In other words, an existing capacitor structure may be used as an OTP memory device. Thus, a photolithographic process is not required to form a control gate in the OTP memory device.

Figure 8:
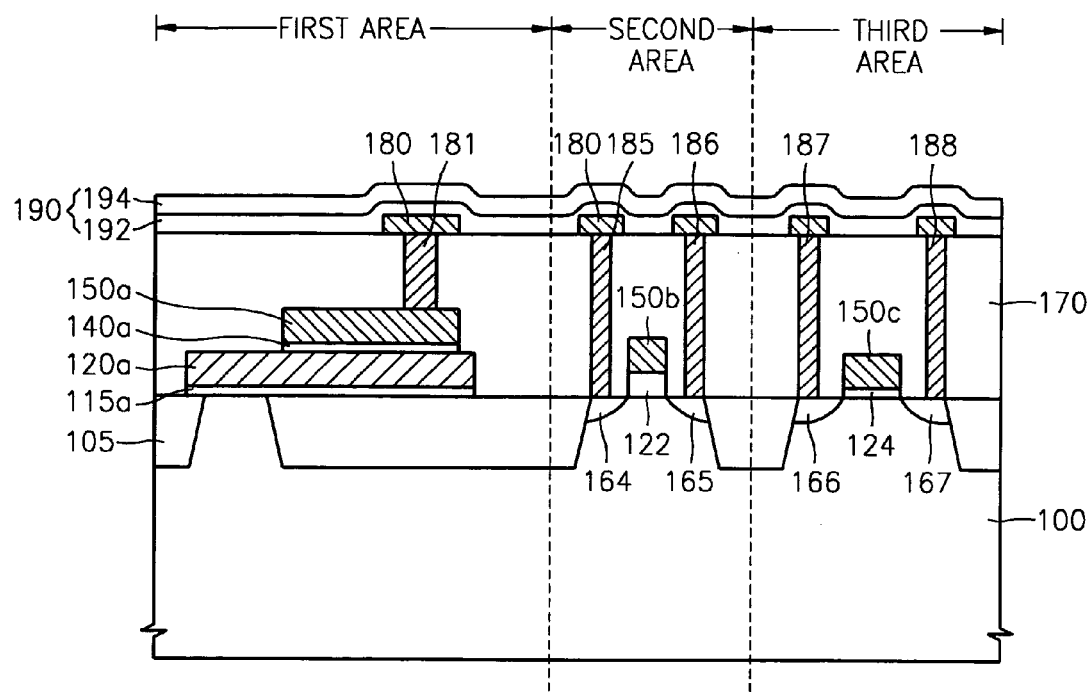
FIG. 8 is a cross-sectional view of a semiconductor IC according to an embodiment of the present invention.

FIG. 8 is a cross-sectional view of a semiconductor IC in which an OTP memory device with a structure as shown in FIGS. 4 through 7 is embedded. In the present embodiment, an OTP memory device, a high voltage MOS transistor, and a low voltage MOS transistor are integrated into a circuit on a semiconductor substrate. The OTP memory device includes a dual-layer gate, i.e., a floating gate and a control gate. Each of the high voltage MOS transistor and the low voltage MOS transistor includes a single-layer gate. In FIG. 8, a portion in which the OTP memory device is to be formed is defined as a first area, a portion in which the high voltage MOS transistor is to be formed is defined as a second area and a portion in which the low voltage MOS transistor is to be formed is defined as a third area.

First, an OTP memory device, like the OTP device described in connection with FIGS. 4-7, is formed in the first area.

In the second area, a relatively thick first gate oxide layer 122 is interposed between a gate 150b of the high voltage MOS transistor and a semiconductor substrate 100. A source region 164 and a drain region 165 are formed in an active area under and adjacent both sides of the gate 150b. A gate spacer (not shown) may be formed on the sidewalls of the first gate oxide layer 122 and the gate 150b. The source and drain regions 164 and 165 may have a lightly doped drain (LDD) or a double diffused drain (DDD) structure due to the gate spacer.

In the third area, a relatively thin second gate oxide layer 124 is interposed between a gate 150c of the low voltage MOS transistor and the semiconductor substrate 100. A source region 166 and a drain region 167 are formed in an active area under and adjacent both sides of the gate 150c. A gate spacer (not shown) may be formed on the sidewalls of the second gate oxide layer 124 and the gate 150c. The source and drain regions 166 and 167 may have an LDD structure or a DDD structure when using the gate spacer.

An interlayer insulating layer 170 is formed on the OTP memory device and the gates 150b and 150c of the high and low voltage MOS transistors. Contacts 185 and 186 are formed in the interlayer insulating layer 170 so as to supply the source and drain regions 164 and 165 of the high voltage MOS transistor with power, respectively. Contacts 187 and 188 are also formed in the interlayer insulating layer 170 so as to supply the source and drain regions 166 and 167 with power, respectively. The contacts 185, 186, 187, and 188 are connected to metal interconnections 180. A passivation layer 190 is formed on the interlayer insulating layer 170 to cover the metal interconnections 180. As previously described, the passivation layer 190 may be formed of a stack of an oxide layer 192 and a nitride layer 194.

The second gate oxide layer 124 may be thinner than the tunnel oxide layer 115a. The first gate oxide layer 122 may be thicker than the tunnel oxide layer 115a and the second gate oxide layer 124. The gates 150b and 150c may be formed of the same material as the control gate 150a. The second gate oxide layer 124 may also have the same thickness as the tunnel oxide layer 115a. The first gate oxide layer 122 may be thicker than the tunnel oxide layer 115a and the second gate oxide layer 124. When the second gate oxide layer has the same thickness as the tunnel oxide layer, the gates 150b and 150c may be formed of the same material as the control gate 150a.

The semiconductor IC having the above-described structure may be fabricated using the following fabrication method according to an embodiment of the present invention. The tunnel oxide layer 115a, the first gate oxide layer 122, and the second gate oxide layer 124 are independently formed. Thus, the deterioration of gate oxide layers can be prevented.

A method of fabricating a semiconductor IC as shown in FIG. 8 will be explained with reference to FIGS. 9 through 15. Like in FIG. 8, in FIGS. 9 through 15, a portion in which an OTP memory device is to be formed is defined as a first area, a portion in which a high voltage MOS transistor is to be formed is defined as a second area and a portion in which a low voltage MOS transistor is to be formed is defined as a third area.

Figure 9:
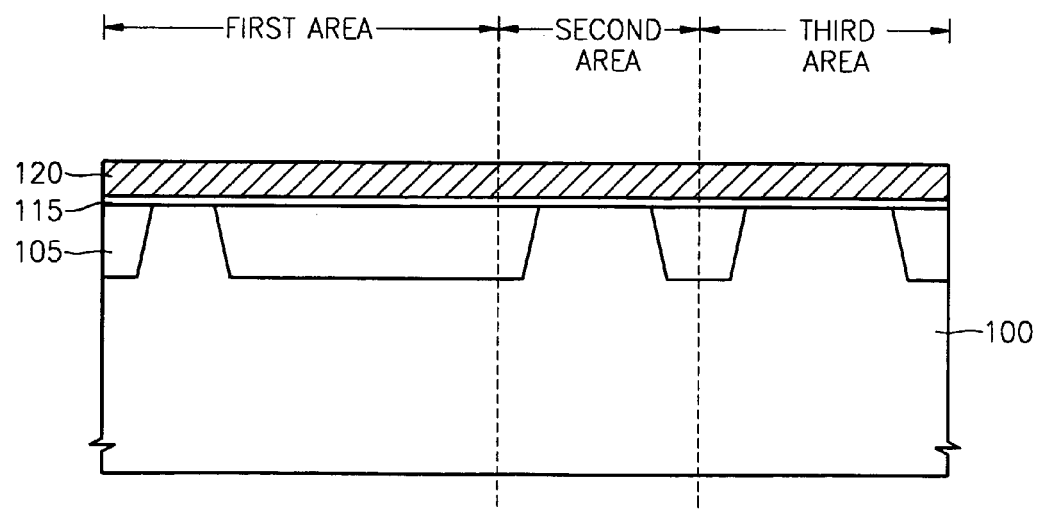
FIGS. 9 through 15 are cross-sectional views for explaining a method of fabricating a semiconductor IC, according to an embodiment of the present invention.

Referring to FIG. 9, isolation layers 105 are formed in a semiconductor substrate 100 using shallow trench isolation (STI) to define first, second, and third areas. Here, the semiconductor substrate 100 may be a silicon substrate or a silicon-on-insulator (SOI) substrate. The isolation layers 105 may be formed using an isolation method suitable for the integration density and characteristics of the semiconductor IC. For example, STI may be used to form trenches in the first, second, and third areas of the semiconductor substrate 100. The trenches may be filled with an insulator, and the OTP memory device, the high voltage MOS transistor, and the low voltage MOS transistors may be isolated from each other. As an alternative, the isolation layers 105 may be formed using Local Oxidation of Silicon (LOCOS) or a combination of LOCOS and STI.

Ion implantation is performed to form a P-well and an N-well using the isolation layers 105 and an additional ion implantation mask. Another ion implantation may be performed to adjust threshold voltages of n-channel MOS (NMOS) and p-channel MOS (PMOS) transistors. For adjustment of the threshold voltage of the NMOS transistor, boron (B) ions may be implanted to a desired depth and at a desired density into areas in which the NMOS transistor and the OTP memory device are to be formed. For adjustment of the threshold voltage of the PMOS transistor, boron difluoride ($BF_2$) and arsenic (As) may be implanted to a desired depth and at a desired density into an area in which the PMOS transistor is to be formed. An ion implantation process for adjusting a threshold voltage of an NMOS transistor known to one of ordinary skill in the art may be used to adjust threshold voltages of the NMOS transistors and the OTP memory device.

Next, a tunnel oxide layer 115 is formed on the semiconductor substrate 100. The tunnel oxide layer 115 is formed to a thickness of about 80 to about 160 Å, for example, to a thickness of 120 Å. The tunnel oxide layer 115 may be formed by thermally oxidizing the semiconductor substrate 100 or may be deposited using atomic layer deposition (ALD). The tunnel oxide layer 115 may be formed by depositing a middle temperature oxide (MTO) using low pressure CVD (LPCVD) and then annealing the MTO. Annealing contributes to curing defects so as to improve leakage current characteristics and reliability of the MTO. It is preferred that an oxide layer formed by one of the three above-described methods has characteristics such as a low defect density, a high interface, an efficient impurity barrier, and the like. The oxide layer may be used as the tunnel oxide layer 115a in the first area. In addition, as shown in FIG. 8, in a case where the second gate oxide layer 124 of the low voltage MOS transistor has the same thickness as the tunnel oxide layer 115a, a portion of the tunnel oxide layer 115 in the third area is not removed so that the remaining portion of the tunnel oxide layer 115 may be used as the second gate oxide layer 124.

Thereafter, a first conductive layer 120 is formed on the entire surface of the semiconductor substrate 100. The first conductive layer 120 may be formed by forming a polysilicon layer and then doping the polysilicon layer with phosphorous (P). The first conductive layer 120 may also be an in-situ doped polysilicon layer. The polysilicon layer may be deposited at a temperature of about 500° C. to about 700° C. using LPCVD. When the in-situ doped polysilicon layer is formed, the impurity doping density of the in-situ doped polysilicon can be adjusted by adjusting flow rate of an impurity source gas to the flow rate of a silicon source gas. For example, the impurity doping density may be above $10^{19}$ $cm^{-3}$. The silicon source gas may be a silane-family gas such as monosilane, disilane, trisilane, dichlorosilane, or the like. The impurity source gas may be phosphine ($PH_3$) or arsine ($AsH_3$). The first conductive layer 120 has a thickness of about 1000 to about 2000 Å, preferably, about 1500 Å.

Figure 10:
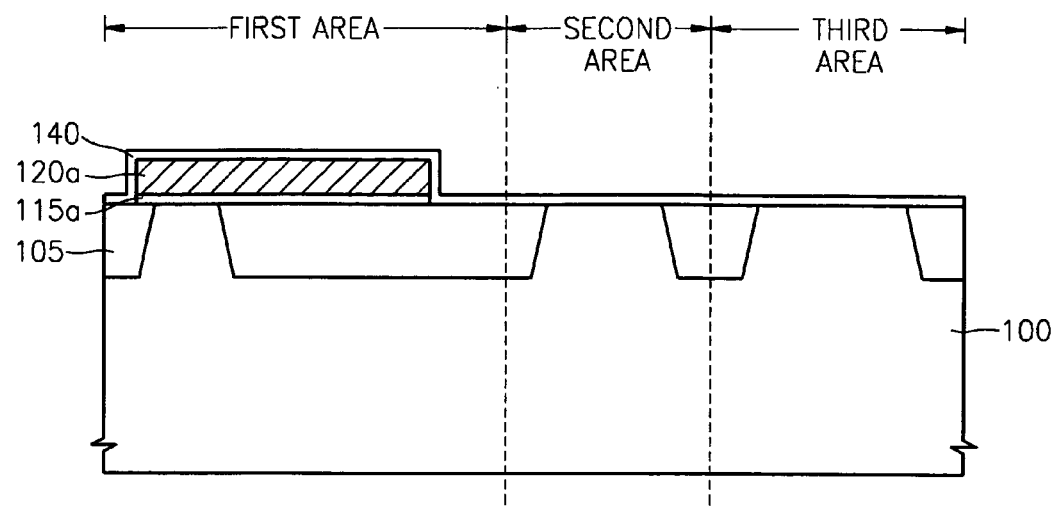

Referring to FIG. 10, a photoresist pattern (not shown) with an opening is formed on the first conductive layer 120. The photoresist pattern is etched using an etch mask to pattern the first conductive layer 120. This patterning process results in formation of a floating gate 120a in the first area. The tunnel oxide layer 115 may be patterned using the floating gate 120a as a mask, leaving the tunnel oxide layer 115 only in the first area so as to form a tunnel oxide layer 115a. If the tunnel oxide layer 115 is not patterned, the tunnel oxide layer will remain on the entire surface of the semiconductor substrate 100. As shown in FIG. 10, a dielectric layer 140 is formed on the substrate 100, including the tunnel oxide layer 115a and the floating gate 120a. The dielectric layer 140 may be an oxide layer, a nitride layer, or a stack of the oxide layer and the nitride layer, for example, an ON layer or an ONO layer. The dielectric layer 140 is formed to a thickness of about 50 to about 400 Å. The dielectric layer 140 may be formed of an oxide by thermally oxidizing a material resulting from a preprocess. It is preferable that the dielectric layer 140 is formed of an ON layer, for example, by stacking an oxide layer with a thickness of about 100 Å and a nitride layer with a thickness of about 200 Å. In order to form the ON layer, an MTO is deposited using LPCVD on the entire surface of the semiconductor substrate 100 on which the floating gate 120a is formed. Next, the MTO is annealed or thermally oxidized to form an oxide layer. Thereafter, a silicon nitride layer is formed using CVD. For formation of the ONO layer, an upper oxide layer is formed by oxidizing the surface of a substrate on which an ON layer is formed. These processes may be performed when gate oxide layers of the high and low voltage MOS transistors are formed.

Figure 11:
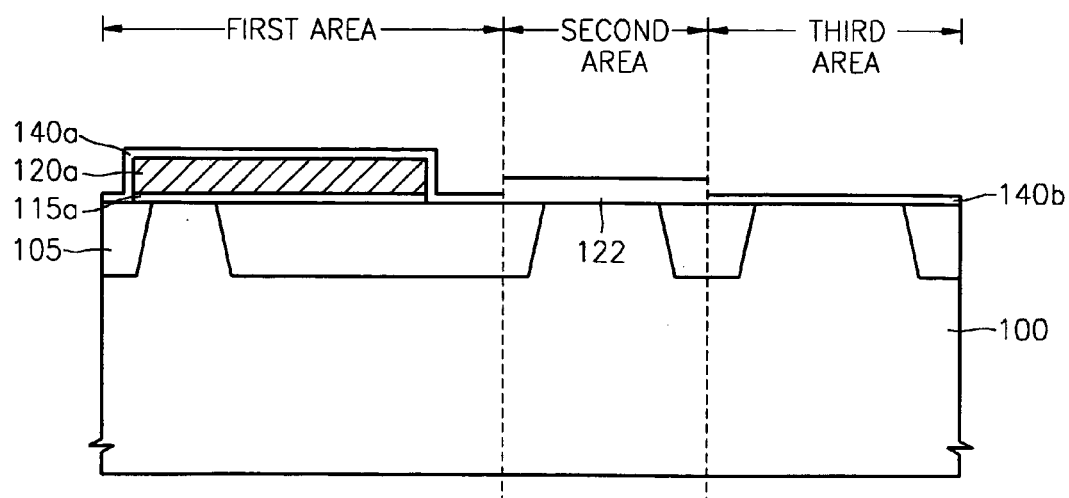

Referring to FIG. 11, the dielectric layer 140 in the second area, i.e., the area in which the high voltage MOS transistor is to be formed, is selectively etched using a mask (not shown) to expose the semiconductor substrate 100. Next, thermal oxidation is performed to form the first gate oxide layer 122. Alternatively, the first gate oxide layer 122 may be formed using CVD or ALD. The thickness of the first gate oxide layer 122 may be determined depending on a voltage of the high voltage MOS transistor. The first gate oxide layer 122 may be formed to a thickness of about 500 to about 900 Å, preferably, to a thickness of about 700 Å. When the dielectric layer 140 is removed to expose a portion of the semiconductor substrate 100 in the second area, a portion of the dielectric layer 140 remains in the first area. The remaining portion of the dielectric layer 140 is called an "inter-gate dielectric layer" and denoted by reference numeral 140a. Reference numeral 140b denotes the portion of the dielectric layer 140 remaining in the third area.

Figure 12:
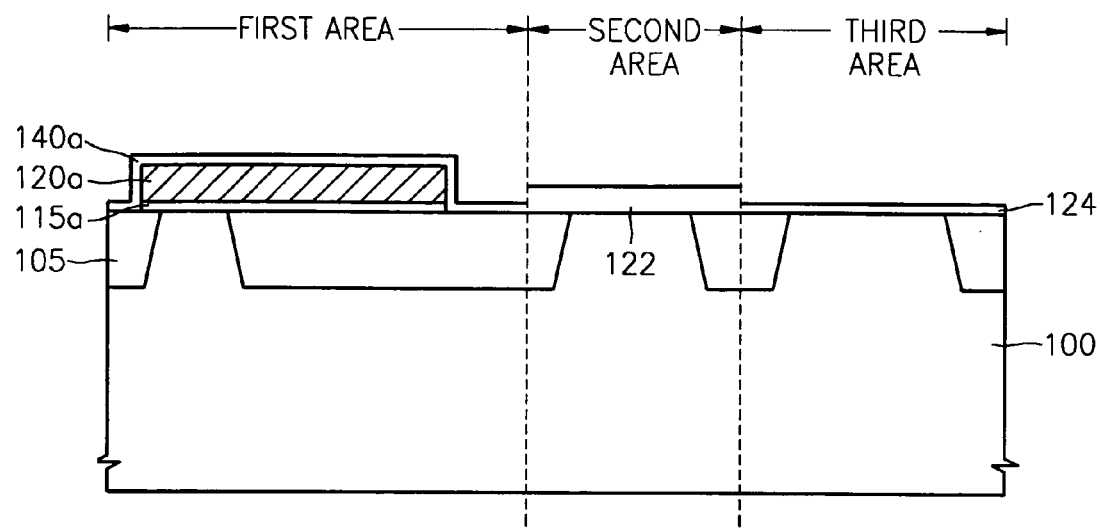

Referring to FIG. 12, the dielectric layer 140b in the third area, i.e., the area in which the low voltage MOS transistor is to be formed, is selectively etched using a mask (not shown) which exposes the semiconductor substrate. Next, a thermal oxide layer is formed to be used as the second gate oxide layer 124. Like the first gate oxide layer 122, the second gate oxide layer 124 may be formed using CVD or ALD. The thickness of the second gate oxide layer 124 may be determined depending on a voltage of the low voltage MOS transistor. The second gate oxide layer 124 may be formed to a thickness of about 30 to about 50 Å, preferably, to a thickness of about 40 Å.

In the event that the dielectric layer 140b is used as a gate oxide layer, an additional process is not required to form the second gate oxide layer 124. In addition, when the second gate oxide layer 124 has the same thickness as the tunnel oxide layer 115, a portion of the tunnel oxide layer 115 may remain in the third area when forming the floating gate 120a, and, therefore, an additional process is not required to form the second gate oxide layer 124.

Figure 13:
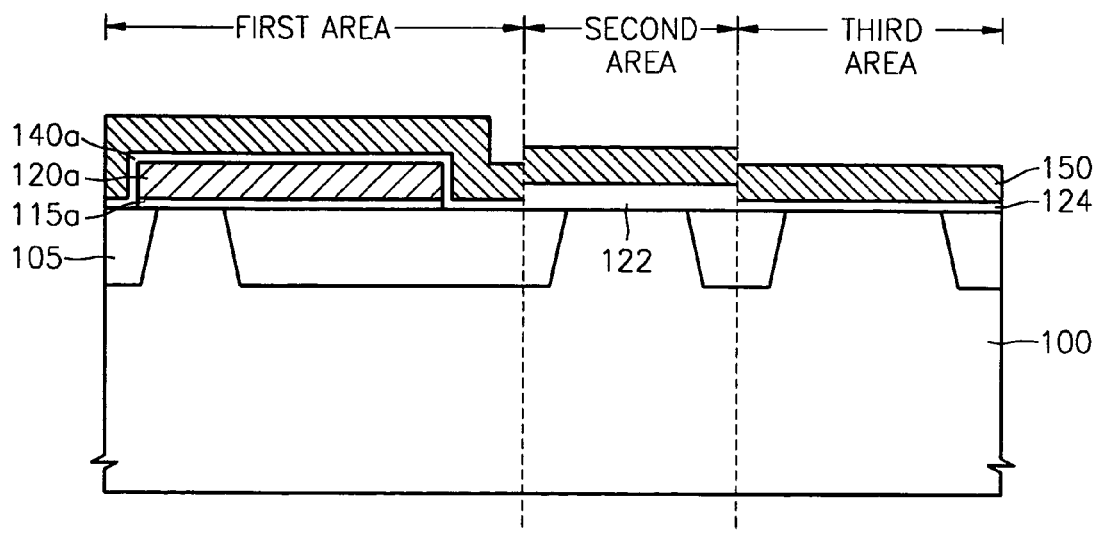

Referring to FIG. 13, a second conductive layer 150 is formed on the entire surface of the semiconductor substrate 100 on which the inter-gate dielectric layer 140a, the first gate oxide layer 122, and the second gate oxide layer 124 are formed. The second conductive layer 150 may be formed using the same method used for forming the floating gate 120a. In other words, the second conductive layer 150 may be a single polysilicon layer having a thickness of about 1000 to about 2000 Å or a dual layer of a polysilicon layer and a silicide layer with a thickness of about 1500 to about 2500 Å. For example, the silicide layer may be formed of cobalt suicide (CoSix), tungsten suicide (WSix), or titanium silicide (TiSix).

Figure 14:
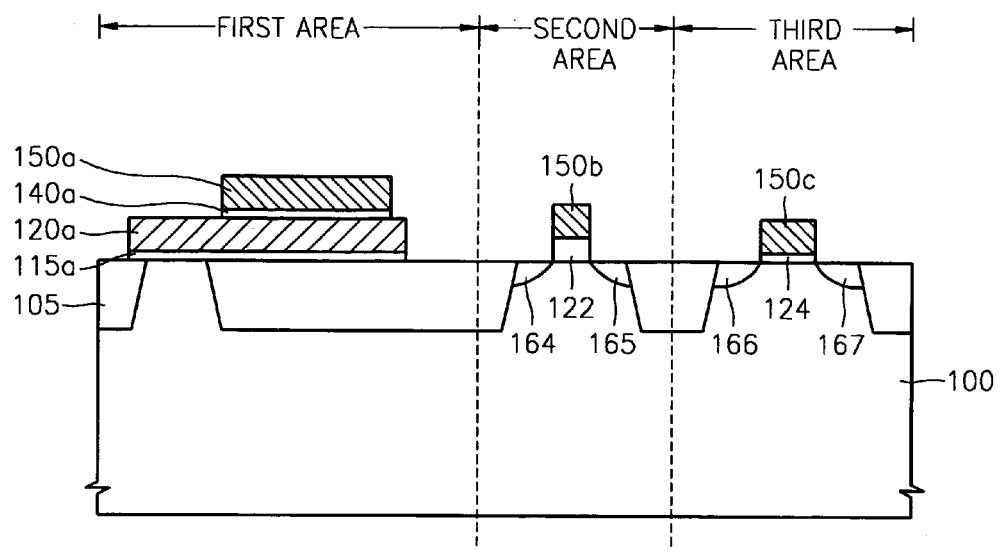

Referring to FIG. 14, the second conductive layer 150 is patterned to form a control gate 150a, a gate 150b (a first gate) of the high voltage MOS transistor, and a gate 150c (a second gate) of the low voltage MOS transistor. In this patterning process, the inter-gate dielectric layer 140a also may be patterned. Thereafter, source and drain regions of the OTP memory cell, the high voltage MOS transistor, and the low voltage MOS transistor are formed. The source and drain regions of the OTP memory cell are not shown in FIG. 14. The source and drain regions of the high voltage MOS transistor are denoted by reference numerals 164 and 165, respectively. The source and drain regions of the low voltage MOS transistor are denoted by reference numerals 166 and 167, respectively. The source and drain regions of the OTP memory device, the source and drain regions if the low and high voltage MOS transistors 164, 165, 166 and 167 may have an LDD structure or a DDD structure.

Figure 15:
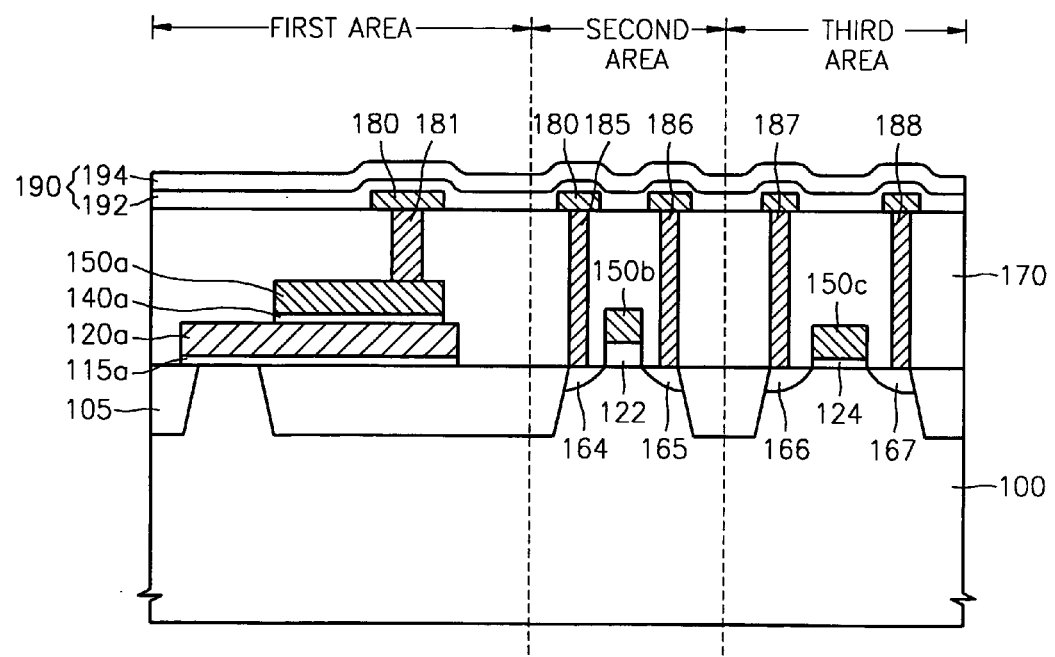

As shown in FIG. 15, an interlayer insulating layer 170 is formed. The interlayer insulating layer 170 may be formed using various methods. The interlayer insulating layer 170 may be a single layer formed using plasma enhanced CVD (PE-CVD), plasma enhanced tetraethyl orthosilicate (PE-TEOS), high density plasma (HDP), high pressure CVD (HPCVD), and low pressure CVD (LPCVD). The interlayer insulating layer 170 may be stacks of layers using PE-CVD, PE-TEOS, HDP, HPCVD, and LPCVD. If necessary, a planarization method using etch back or chemical mechanical polishing (CMP) may be performed together with PE-CVD, PE-TEOS, HDP, HPCVD, and/or LPCVD so as to planarize the surface of the interlayer insulating layer 170. Preferably, layers use HDP and PE-TEOS, respectively, and then are stacked to have a thickness of about 11,000 Å. Next, the stacked layer is planarized using CMP so that an oxide layer with a thickness of about 7,000 Å remains on the control gate 150a.

After formation of the interlayer insulating layer 170 is completed, contact holes are formed in the interlayer insulating layer 170 using a photolithographic process to expose the source and drain regions 164 and 165 of the high voltage MOS transistor, the source and drain regions 166 and 167 of the low voltage MOS transistor, the control gate 150a and the source and drain regions (not shown) of the OTP memory device. The contact holes are filled with a conductive material to form contacts 181, 185, 186, 187, and 188. Metal interconnections 180 are formed to be connected to the control gate 150a of the OTP memory device, the source and drain regions 164 and 165, and the source and drain regions 166 and 167 via the contacts 181, 185, 186, 187, and 188, respectively. In order to reduce resistances of the contacts 181, 185, 186, 187, and 188, the metal interconnections 180 may include a stack of titanium (Ti) with a thickness of about 50 to about 150 Å, preferably, about 150 Å, aluminum (Al) with a thickness of about 4000 to about 7500 Å, and titanium nitride (TiN) with a thickness of about 100 to about 400 Å, preferably, about 250 Å. The metal interconnections 180 may be single layers formed of a high melting temperature type metal such as tungsten, single layers formed of silicide or copper, or composite layers of tungsten and silicide or copper.

The metal interconnections 180 may include multi-layers. In this case, interlayer insulating layers between the multi-layers may be single layers formed using PE-CVD, PE-TEOS, HDP, HPCVD, LPCVD, or coating of organic spirr-on-glass (SOG) or inorganic SOG. The interlayer insulating layers of the multi-layers may also be stacks of layers formed using PE-CVD, PE-TEOS, HDP, HPCVD, LPCVD, and coating of organic SOG or inorganic SOG. The single layers or the stacks may be planarized using etch back or CMP, and then contact holes and metal interconnections may be formed.

Thereafter, in order to protect the semiconductor IC from external effects, a passivation layer 190 is formed. Contact windows (not shown) are formed to be connected to external interconnections. The passivation layer 190 may be a composite layer of an oxide layer 192 and a nitride layer 194. A polyimide layer may be additionally formed on the passivation layer 190.

As described above, an OTP memory device according to an embodiment of the present invention can have a spread capacitor structure. The OTP memory device and MOS transistors can be integrated into a circuit. In the IC, the thickness of a tunnel oxide layer of the OTP memory device and the thicknesses of gate oxide layers of the MOS transistors can be independently controlled. The reliability of the gate oxide layers of the MOS transistors can be improved. In particular, even when the gate oxide layers of the MOS transistors have different thicknesses, the reliability of the gate oxide layers can be prevented from being deteriorated.

Moreover, the OTP memory device can be fabricated together with other types of devices using processes for fabricating the other types of devices. Thus, additional processes for fabricating the OTP memory device can be reduced. The OTP memory device may be fabricated as the spread capacitor in an LDI or the like and the processes for fabricating the OTP memory device can be simplified and cost of fabricating the OTP memory device can be reduced. Furthermore, the OTP memory device can contribute to reducing deterioration due to chemicals of the gate oxide layers of the MOS transistors having different thicknesses in the IC. As a result, the reliability and characteristics of the IC can be improved.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. An integrated circuit, comprising:
   a plurality of isolation layers for defining a first area, a second area, and a third area in a substrate;
   a memory device including a floating gate formed over the first area and at least one isolation layer of the plurality of isolation layers, an inter-gate dielectric layer formed on the floating gate and including a composite layer having a silicon oxide layer and a silicon nitride layer, and a control gate formed on the inter-gate dielectric layer;
   a first transistor including a first gate formed of the same material as the control gate, wherein the first gate is formed in the second area of the substrate on a first gate oxide layer having a thickness greater than or equal to a thickness of a tunnel oxide layer formed on the substrate, and a first source region and a first drain region formed in the second area at least one of under or adjacent both sides of the first gate; and
   a second transistor including a second gate formed of the same material as the control gate, wherein the second gate is formed in the third area of the substrate on a second gate oxide layer thinner than the first gate oxide layer, and a second source region and a second drain region formed in the third area at least one of under or adjacent both sides of the second gate, wherein a first portion of the floating gate formed over the first area is narrower than a second portion of the floating gate formed over the at least one isolation layer, and wherein the control gate is formed over the second portion of the floating gate and not over the first portion of the floating gate, and a plurality of edges of the control gate do not extend to corresponding edges of the floating gate.

2. An integrated circuit, comprising:
   a memory device including an isolation layer for defining an active area of a substrate, a tunnel oxide layer formed on the active area, a floating gate formed over the active area and the isolation layer, an inter-gate dielectric layer formed on the floating gate, and a control gate formed on the inter-gate dielectric layer;
   a first transistor including a first gate, a first gate oxide layer interposed between the first gate and the substrate, and a first source region and a first drain region formed in the active area at least one of under or adjacent both sides of the first gate; and
   a second transistor including a second gate, a second gate oxide layer interposed between the second gate and the substrate, and a second source region and a second drain region formed in the active area at least one of under or adjacent both sides of the second gate, wherein the second gate oxide layer is thinner than the tunnel oxide layer, and the first gate oxide layer is thicker than the tunnel oxide layer and the second gate oxide layer.

3. The integrated circuit of claim 2, wherein the memory device further includes a source region and a drain region formed in the active area at least one of under or adjacent both sides of the floating gate.

4. The integrated circuit of claim 2, wherein the first gate and the second gate are formed of the same material as the control gate.

* * * * *